April 2, 1968 H. RÜMMER 3,376,510

COMBINED UHF-VHF TUNER

Filed Nov. 29, 1963 3 Sheets-Sheet 1

Inventor:
Heribert Rümmer
By: Spencer & Kaye
ATTORNEYS

April 2, 1968 H. RÜMMER 3,376,510

COMBINED UHF-VHF TUNER

Filed Nov. 29, 1963 3 Sheets-Sheet 2

Inventor:
Heribert Rümmer
By: Spencer & Kaye
ATTORNEYS

April 2, 1968 H. RÜMMER 3,376,510

COMBINED UHF-VHF TUNER

Filed Nov. 29, 1963 3 Sheets-Sheet 3

Inventor:
Heribert Rümmer
By: Spencer & Kaye
ATTORNEYS

United States Patent Office 3,376,510

Patented Apr. 2, 1968

3,376,510

COMBINED UHF-VHF TUNER

Heribert Rümmer, Ingolstadt (Danube), Germany, assignor to Telefunken Patentverwertungs-G.m.b.H., Ulm (Danube), Germany Filed Nov. 29, 1963, Ser. No. 327,338
Claims priority, application Germany, Nov. 29, 1962, T 23,091
9 Claims. (Cl. 325—459)

ABSTRACT OF THE DISCLOSURE

A combination UHF–VHF tuner enclosed in a single housing which is divided into two parts by an insulating partition wall, one of the parts containing the VHF tuning circuitry and the other part containing the UHF tuning circuitry, the housing also containing at least three transistors and a plurality of switches, the whole arrangement being so connected that the actuation of the various sets of switches select the frequency band and the selection of a single frequency within each band is controlled by the rotation of a shaft carrying a plurality of rotary capacitors, the transistors being so connected with the various circuit elements as to constitute, respectively, a preamplifier, a mixer-oscillator or a local oscillator, and a mixer or IF-amplifier, the output from the third transistor being in the form of an IF-signal.

The present invention relates to a channel selector switch for use in television sets, which switch is a combination switch usable for both UHF (ultra-high frequency) and VHF (very-high frequency), the UHF range being that portion of the frequency spectrum which is between 300 and 3,000 megacycles and the VHF range being that portion of the frequency spectrum which is between 30 and 300 megacycles.

Conventionally, television channel switches incorporate two components, one for UHF reception and the other for VHF reception, each component in itself being a closed entity which is proof against interferences or stray radiation.

There also exist combination television channel switches which are constituted by two separate units that are mechanically interconnected by appropriate means. Channel switches of this type incorporate circuitry and structural elements each of which is designed to operate only in either the VHF or UHF band, so that each unit must, as a matter of course, be equipped with separate tuning means.

In another type of combination channel switch, there is a common shaft carrying the usual revolver or drum-type casing one each for VHF and UHF, or the UHF tuning means are arranged within the VHF switching drum in the form of tunable coaxial lines. One particular difficulty in the case of the drum-type arrangement of the UHF component is to provide radiation-proof shielding and to provide the tuning for the individual circuits. If tunable coaxial lines are placed within the VHF drum, the mounting and adjusting of the coaxial lines, which are ordinarily simple and inexpensive matters, become difficult problems.

If yet another type of existing television channel selector, the tuning means for the UHF and VHF are combined with each other into a closed circuit and structural entity, the amplifier elements, the structural elements, and also the tuning means being used, in part, for both the UHF and VHF bands. The UHF tank circuits are tuned inductively or capacitatively throughout the entire band, the tuning in the VHF band being effected inductively either by switching the circuit inductances by means of the usual switching drums, or by serially connecting LC-members with the inner conductors of the UHF tank circuits which inner conductors are fashioned as variometers.

It will be seen that all of the above-described channel switches possess a number of practical drawbacks, and it is, therefore, a primary object of the present invention to provide a combination channel selector switch which avoids these drawbacks. Accordingly, the present invention resides in a channel selector switch which incorporates three transistors, the first serving as a preamplifier stage for the UHF and VHF, the second transistor serving as a self-oscillating mixer stage for UHF and VHF or as a self-oscillating mixer stage for UHF and as an oscillator voltage generator for VHF, and the third transistor serving as an IF (intermediate frequency) amplifier for UHF and VHF or as an IF amplifier for UHF and as an oscillator for VHF.

According to another feature of the present invention, the switch has a housing which is divided into two halves by a partition. Arranged in one of the two chambers are quarter wave length ($\lambda/4$) tank circuits for the UHF band, while the inductance coils for VHF are arranged in the other chanmber. The tuning for the band pass filter circuits, and for the oscillator circuits, may be effected continuously, for all bands, with the same tuning capacitors. The band change-over is effected by serially connecting inductances to the inner conductors of the tank circuits, or by disconnecting these inductances. The transistors which are arranged in openings in the partition and in the VHF portion carry out their respective functions during operation in the UHF and VHF bands.

Thanks to the fact that but a single tuning means, namely, a rotary capacitor, is used for tuning all of the bands, and thanks also to the use of quarter wave length tank circuits and transistorized circuits wherein the characteristics of the transistors are employed to best advantage, there is obtained a combination channel selector switch for both UHF and VHF, which switch has very small dimensions. Another advantage that is obtained is that the partition, which is made of insulating material, may carry the inner conductors of the tank circuits in the manner of printed circuitry, thereby avoiding the often difficult problems incident to soldering the inner conductors, as well as eliminating the need for providing insulating supports for the inner conductors.

Furthermore, the side of the partition which is directed away from the inner conductors of the tank circuits can serve to carry printed circuitry for the other circuit components such as the resistors, capacitors, inductance coils, transistors, tubes, contacts for test points or support points, and the like.

Additional objects and advantages of the present invention will become apparent upon consideration of the following description when taken in conjunction with the accompanying drawings in which.

Figure 1:
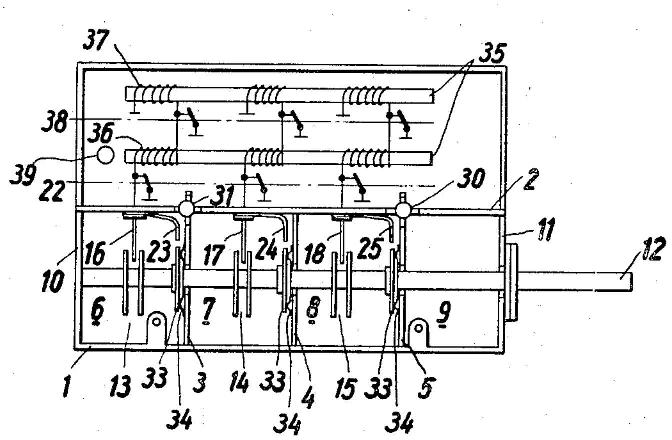
FIGURE 1 is a plan view showing the main components in the housing of a television channel selector switch according to the present invention.
Figure 5:
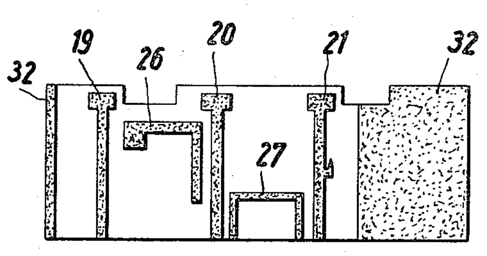
FIGURE 5 is an elevational view showing the insulating partition which carries the inner conductors of the tank circuits.

Referring now to the drawings and to FIGURES 1 and 5 thereof in particular, the same show a metal housing 1 which has end walls 10 and 11 and which is divided into two halves by a partition 2 made of insulating material which is slidably insertable into the housing. One of the halves is divided, by means of transverse walls 3, 4, and 5, into chambers 6, 7, 8 and 9. A tuning shaft 12 is rotatably mounted in end walls 10 and 11 of the housing 1 and passes through aligned openings in walls 3, 4 and 5. The shaft 12 carries three rotors 13, 14 and 15, of a three-stage rotary capacitor, whose stators 16, 17 and 18, are soldered to the "hot" ends of the inner conductors 19, 20, and 21, that are printed onto the partition 2. For UHF reception, the "cold" ends of these inner conductors are grounded via contacts 22 which connect the base points of the inner conductors, i.e., the lower ends of these conductors, as viewed in FIGURE 5, to ground. The chambers 6, 7, 8, together with the respective rotary capacitors and inner conductors 19, 20, 21, form tank circuits for the UHF band. Soldered to the stators 16, 17, 18, are balancing trimmers 23, 24, 25, the same being constituted by a metal strip and the respective transverse wall. Arranged between the inner conductors 19, 20, and 20, 21, are the printed coupling conductors 26, 27 (FIGURE 5).

The side of the partition 2 which is opposite to that which carries the inner conductors of the tank circuits, carries a printed circuit for use with the other circuitry, this printed circuit having additional coupling loops which are arranged opposite the corresponding inner conductors 20, 21. The partition 2 is also provided with recesses within which the transistors 30 and 31 are arranged. The partition 2 is held in place by slits in the end walls 10, 11, and in the transverse walls 3, 5, and, by means of a printed lead 32, is soldered to these walls and/or to the bottom of the housing.

The tuning shaft 12 carries conventional contact discs 33 which are contacted by spring-type brushes 34, the same covering the openings of the transverse walls.

The other half of the housing 1 has arranged within it the supported coil carriers 35 which support the inductance coils 36, 37, needed for the change-over from UHF to VHF. These inductance coils are connected in series with the inner conductors, the inductance coils 36 being groundable by the above-mentioned switches 22 and the inductance coils 37 being groundable by further switches 38, so that the various inductance coils can be taken out of the circuit upon change-over to higher frequencies, or be inserted into the circuit upon change-over to lower frequencies.

The VHF portion of the housing 1 also incorporates the transistor 39.

The housing 1, shown as being open on one side, i.e., at the top, is closable by a metallic radiation shielding cover.

Figure 2:
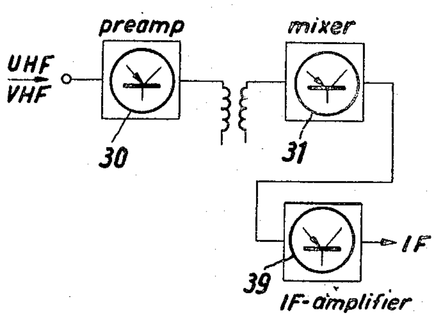
FIGURE 2 is a block diagram showing the function of the transistors for UHF or VHF reception.
Figure 3:
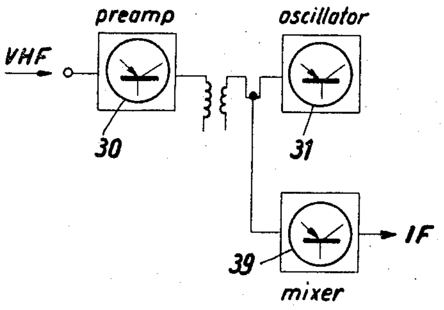
FIGURE 3 is a further block diagram showing the function of the transistors for VHF reception.

FIGURES 2 and 3 show how the transistors are used for UHF and VHF reception.

FIGURE 2 illustrates the basic circuit arrangement for UHF or VHF reception. The signal coming from the antenna is applied to the pre-amplifier stage constituted by the transistor 30, and is applied, via a UHF tank circuit band pass filter, to the second transistor 31 which operates as a self-oscillating mixer stage. The thus-obtained intermediate frequency is amplified by the transistor 39 operating as an IF amplifier.

FIGURE 3 illustrates the circuit arrangement for VHF reception. Here, the transistor 30 again operates as a preamplifier, but the amplified antenna signal is now applied, via the band pass filter constituted by the coils of the VHF portion, to the transistor 39 which now operates as a mixer stage, the oscillator frequency being produced separately by the transistor 31 and applied to the mixer stage.

Figure 4:
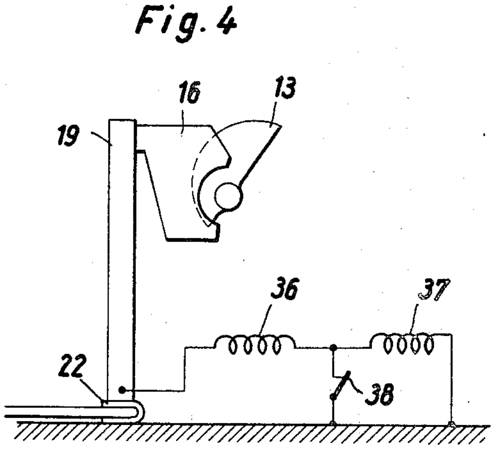
FIGURE 4 shows how the band change-over is effected and how the same tuning capacitor is used for tuning within each band.

FIGURE 4 shows how the change-over from Band IV to Band III or to Band I is effected. (Band I designates a frequency range of 68 to 41 megacycles (wave length: 4.41 to 7.32 meters); Band III designates a frequency range of 223 to 174 megacycles (wave length: 1:35 to 1.72 meters), and Band IV designates a frequency range of 790 to 470 megacycles (wave length: 38 to 63.8 centimeters). Bands I and III thus fall into the VHF range, while Band IV falls into the UHF range. Within each band are a certain number of individual channels, i.e., narrow frequency bands, each used for transmitting and receiving a typical television broadcast.) Each resonant tank circuit for the UHF band (Band IV) is formed by the housing, the tuning capacitor and the inner conductor which is grounded at its base point. If the arrangement is now to be changed over to one of the VHF bands, say, Band III, switch 22 is opened, thereby connecting inductance coil 36 in series with the inner conductor. The inductance coil 36 is grounded via switch 38 and, having the appropriate inductance, changes the resonant frequency into the range of Band III. By opening switch 38, the coil 37, which up to now was short-circuited, is introduced into the series circuit, so that, thanks to the additional inductance, the resonant frequency is then changed over to that of Band I. The continuous, i.e., infinitely variable, tuning of the resonant circuits within each band, both in the UHF and VHF range, is carried out by means of the same tuning capacitor.

Figure 6:
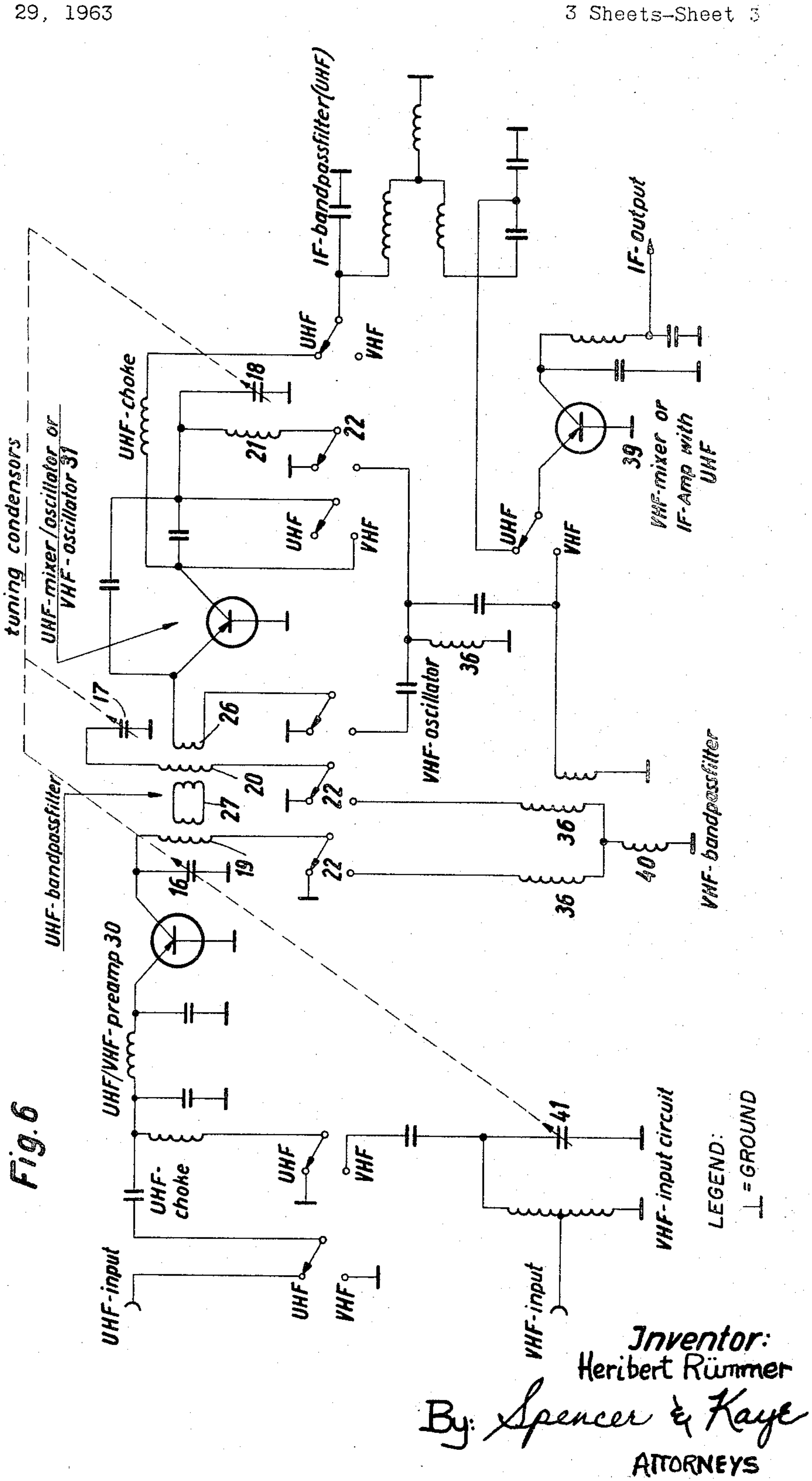
FIGURE 6 is a circuit diagram of a channel selector switch according to FIGURE 1.

FIGURE 6 is a circuit diagram of the channel selector switch of FIGURES 1 and 5, the inner conductors 19, 20, 21, being represented as inductances, and the various components being identified by the same reference numerals as in FIGURES 1 to 5. The circuit is shown with the parts occupying the UHF receiving position. For the sake of simplicity, the inductance coils 37 and switches 38 of FIGURE 4 are not shown. Also, the circuit of FIGURE 6 differs from the structure of FIGURE 1 in that the inductance coils 36 are not grounded but are provided with a common base point inductance 40 so as to provide a band pass filter for the VHF range as well. The rotary capacitors 16, 17, 18 and 41 are shown as being mechanically ganged (cf. shaft 12 in FIGURE 1), the capacitor 41 being effective only for VHF operation.

The circuit of FIGURE 6 is shown with all of its two-position switches in their UHF selector position. When the switches are in this position, the VHF-input is disconnected from the circuit and the preamplifier 30 has its input connected to the UHF-input via a UHF-choke and a filter circuit. The inner conductors 19, 20 and 21 are connected directly to ground via the respective switches 22 and the rotary capacitors 16, 17 and 18 are adjusted by the rotation of shaft 12 (FIGURE 1) so as to tune their respective resonant circuits to a desired UHF channel. The output from preamplifier 30 is conducted via the UHF-band pass filter composed of elements 16, 19, 27, 20, 17 and 26 to the input of the circuit incorporating transistor 31. When the two-position switches are in the positions shown, this latter circuit acts as a combination mixer-oscillator which mixes the received signal whose frequency, which is varied by capacitor 18, is such as to produce an IF-signal having the desired frequency. This output signal is fed via a UHF-choke to an IF-band pass filter having a fixed resonant frequency, the signal passed by the filter being fed to the input of the amplifier circuit incorporating transistor 39, which circuit is connected to operate as an IF-amplifier.

If it is now desired to convert the circuit for reception of a VHF-signal, all of the two-position switches are moved to their other contact positions (downwardly in the illustration of FIGURE 6). This movement of the switches serves to disconnect the UHF-input from the input of preamplifier 30 and to connect the VHF-input thereto through the intermediary of the tuned VHF-input circuit including variable capacitor 41. Shaft 12 is rotated into a position corresponding to the VHF channel to be received. If the channel to be receiced lies in Band III, switches 38 (not shown in FIGURE 6) are left closed so as to leave inductors 37 (also not shown) effectively out of the circuit. With the capacitors 16, 17, 18 and 41 adjusted so as to tune their respective resonant circuits to the desired VHF channel, the signal from the VHF-input is fed to the input of preamplifier 30 and from this preamplifier it is fed via a band pass filter to the input of the amplifier circuit incorporating transistor 39. The circuit incorporating transistor 31 now operates as a local, or beat frequency oscillator and also feeds its output to the input of transistor 39, which now operates as a mixer.

One of the principal advantages of the circuit according to the present invention resides in the separation of the local oscillator and mixer functions. It has been found that this separation is particularly desirable for tuning the lower VHF frequencies because the difference between these frequencies and the desired IF frequency is so small that the use of a combined mixer-oscillator requires the provision of a relatively complicated and expensive decoupling filter between the oscillator circuit and the IF-filter.

It will be understood that the above description of the present invention is susceptible to various modifications, changes, and adaptations, and the same are intended to be comprehended within the meaning and range of equivalents of the appended claims.

What is claimed is:

1. A channel selector for selecting channels in the VHF and UHF bands and comprising, in combination: a housing; a partition in said housing and dividing the same into two halves; tank circuit means arranged in one of said halves of said housing; inductance coil means for VHF operation arranged in the other of said halves of said housing and forming part of band pass filter circuits; a single mechanical tuning device for continuously tuning said band pass filter circuits and said tank circuits in all bands of UHF and VHF; a first transistor for amplifying UHF and VHF signals and connected to said tank circuit means; a second transistor; a third transistor; and means operable at UHF for applying the output of said first transistor to said second transistor, the latter acting as a self-oscillating mixer stage and for applying the output of said second transistor to said third transistor, the latter acting as an IF amplifier, said last-mentioned means being operable at VHF for applying the output of said first transistor and the output of said said second transistor, the latter acting as an oscillator voltage generator, to said third transistor, the latter acting as a mixer stage.

2. A television channel selector for selecting channels in both the VHF frequency band and the UHF frequency band, comprising, in combination:

(a) a UHF frequency band input circuit for receiving signals in the UHF frequency band;

(b) a VHF frequency band input circuit for receiving signals in the VHF frequency band;

(c) a first amplifier element for use as a high frequency preamplifier of signals in both the VHF and UHF frequency bands;

(d) first switch means connected between the input of said first amplifier element and both of said input circuits and switchable between a first condition, in which said UHF input circuit is connected to said first amplifier element input, and a second condition in which said VHF input circuit is connected to said first element input;

(e) band pass filter means having an input connected to the output of said first amplifier element and having a first output and a second output;

(f) second switch means connected in said filter means and switchable between a first condition, in which said filter means are made to have a pass band in the UHF frequency range and to pass signals appearing at said filter means input to said first output thereof, and a second condition, in which said filter means are made to have a pass band in the VHF frequency range and to pass signals appearing at said filter means input to said second output thereof;

(g) oscillatory circuit means including a second amplifier element having an input connected to said first output of said bandpass filter means;

(h) third switch means connected in said oscillatory circuit means and switchable between a first condition, in which said oscillatory circuit means define a self-oscillating mixer stage which converts a signal at said second element input into an intermediate frequency signal output, and a second condition, in which said oscillatory circuit means define a beat frequency oscillator producing a beat frequency output;

(i) a third amplifier element having an input connected to the output of said oscillatory circuit and, at least when said second switch means are in their said second condition, to said second output of said bandpass filter means;

(j) whereby when all of said switch means are in their said first condition, said third element receives at its said input the intermediate frequency output of said oscillatory circuit and functions as an IF-amplifier, and when all of said switch means are in their said second condition, said third element receives at its said input the VHF signal appearing at said second output of said filter means and the beat frequency output of said oscillatory circuit and functions as a mixer producing an IF-output; and (k) control means for simultaneously switching all of said switch means selectively to their said first condition for UHF reception or to their said second condition for VHF reception.

3. An arrangement as defined in claim 2 wherein each of said amplifier elements is constituted by a transistor.

4. A television channel selector for selecting channels in both the UHF and VHF frequency bands, comprising in combination:

(a) a UHF-input circuit for receiving signals in the UHF frequency band;

(b) a VHF-input circuit for receiving signals in the VHF frequency band;

(c) a first transistor having its input selectively connectable to one or the other of said input circuits for preamplifying the signal applied to its input;

(d) first, second and third tank circuits each including a variable capacitor and having a resonant frequency in the UHF frequency band, all of said capacitors being gauged for tuning said tank circuits in unison and said first tank circuit being inductively coupled to said second tank circuit;

(e) reactive circuit means;

(f) first switch means connected between said first and second tank circuits and said reactive circuit means and switchable between a first condition and a second condition, wherein in said first condition said first tank circuit is connected across the output of said first transistor and said first and second tank circuits define a UHF bandpass filter for passing signals corresponding to an elected channel in the UHF band, while in said second condition said first tank circuit and at least part of said reactive circuit means are connected across the output of said first transistor and said first and second tank circuits are connected to said reactive circuit means to define a VHF bandpass filter for passing signals corresponding to a selected channel in the VHF range;

(g) a second transistor having its input coupled to said second tank circuit and its output connected to one side of said third tank circuit;

(h) VHF oscillator circuit means selectively connectable between said second and third tank circuits so as to be coupled between the input and output of said second transistor for cooperating with said second transistor to define a beat frequency oscillator;

(i) intermediate frequency bandpass filter means having an input selectively connectable to the output of said second transistor for passing a signal having a predetermined intermediate frequency;

(j) a third transistor for producing an intermediate frequency output; and (k) second switch means connected between said second and third transistors, said VHF oscillator circuit, said third tank circuit, said intermediate frequency bandpass filter means and the output of said VHF bandpass filter and switchable between a first condition and a second condition, wherein in said first condition said third tank circuit is connected across the output of said second transistor to constitute a mixer-oscillator which transforms a UHF signal applied to the input of said second transistor into an intermediate frequency signal appearing at the output of said second transistor, and said intermediate frequency bandpass filter means have their input connected to the output of said second transistor and their output connected to the input of said third transistor, while in said second condition said VHF oscillator circuit means are connected to cooperate with said second transistor to define said beat frequency oscillator, and both the output of said beat frequency oscillator and the output of said VHF bandpass filter are connected to the input of said third transistor.

5. An arrangement as defined in claim 4 wherein said VHF input circuit includes a further variable capacitor which is ganged to said first mentioned variable capacitors.

6. An arrangement as defined in claim 4 wherein said reactive circuit means are constituted by a plurality of inductances selectively connectable together for varying the pass band of the bandpass filter which they define.

7. An arrangement as defined in claim 6 wherein each said inductance is serially connectable to a respective one of said first and second tank circuits.

8. A switch as defined in claim 7, further comprising: a housing; and a partition in said housing and dividing the same into two halves, said tank circuits being arranged in one of said halves of said housing and said inductance means being arranged in the other of said halves of said housing.

9. A switch as defined in claim 8 wherein said ganged capacitors are actuated by a single shaft extending through said one half of said housing.

References Cited

UNITED STATES PATENTS

| | | | |
|---|---|---|---|
| 2,826,687 | 3/1958 | Fisher | 325—460 |
| 2,922,043 | 1/1960 | Decker | 325—463 |
| 2,995,655 | 8/1961 | Meadows | 325—459 |
| 3,003,060 | 10/1961 | Lewis | 325—461 |
| 3,036,212 | 5/1961 | Meyer | 325—459 |
| 3,275,958 | 9/1966 | Rehm | 334—2 |
| 3,252,096 | 5/1966 | Carlson | 325—459 |

KATHLEEN H. CLAFFY, *Primary Examiner.*

R. P. TAYLOR, *Assistant Examiner.*